(12) United States Patent
Yu

(10) Patent No.: US 8,222,715 B2
(45) Date of Patent: Jul. 17, 2012

(54) SEMICONDUCTOR DEVICE CAPABLE OF REDUCING A CONTACT RESISTANCE OF A LOWER ELECTRODE AND A CONTACT PAD AND PROVIDING AN ALIGN MARGIN BETWEEN THE LOWER ELECTRODE AND THE CONTACT PAD

(75) Inventor: Man-Jong Yu, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 199 days.

(21) Appl. No.: 12/728,569

(22) Filed: Mar. 22, 2010

(65) Prior Publication Data
US 2010/0244191 A1    Sep. 30, 2010

(30) Foreign Application Priority Data
Mar. 26, 2009  (KR) ........................ 10-2009-0025755

(51) Int. Cl.
*H01L 27/08* (2006.01)
(52) U.S. Cl. ................................ 257/532; 257/E27.048
(58) Field of Classification Search .................... 257/68, 257/71, 296, 298, 532, E29.111, E27.148
See application file for complete search history.

(56) References Cited

U.S. PATENT DOCUMENTS

| | | | |
|---|---|---|---|
| 2001/0003663 A1* | 6/2001 | Huang | 438/240 |
| 2004/0238867 A1* | 12/2004 | Park | 257/300 |
| 2005/0263814 A1* | 12/2005 | Kim et al. | 257/306 |
| 2006/0211192 A1* | 9/2006 | Cho et al. | 438/238 |
| 2009/0008744 A1* | 1/2009 | Nishi | 257/532 |

FOREIGN PATENT DOCUMENTS

| | | |
|---|---|---|
| JP | 2000-077622 | 3/2000 |
| KR | 10-2003-0002745 | 1/2004 |
| KR | 1020040060317 | 7/2004 |

* cited by examiner

*Primary Examiner* — Davienne Monbleau
*Assistant Examiner* — Selim Ahmed
(74) *Attorney, Agent, or Firm* — F. Chau & Associates, LLC

(57) ABSTRACT

A semiconductor device includes an insulation interlayer and an etch stop layer sequentially stacked on a substrate wherein a lower structure including a first contact pad is formed. A second contact pad penetrates the insulation interlayer and the etch stop layer and is connected to the first contact pad. The second contact pad protrudes from the etch stop layer. A pad spacer is provided between the second contact pad and the insulation interlayer. A lower electrode is provided on the etch stop layer and is connected to the second contact pad. A dielectric layer and an upper electrode are sequentially provided on the lower electrode.

2 Claims, 15 Drawing Sheets

SEMICONDUCTOR DEVICE CAPABLE OF REDUCING A CONTACT RESISTANCE OF A LOWER ELECTRODE AND A CONTACT PAD AND PROVIDING AN ALIGN MARGIN BETWEEN THE LOWER ELECTRODE AND THE CONTACT PAD

CROSS-REFERENCE TO RELATED PATENT APPLICATION

This application claims priority under 35 U.S.C. §119 to Korean Patent Application No. 10-2009-0025755, filed on Mar. 26, 2009, the disclosure of which is hereby incorporated by reference herein in it's entirety.

BACKGROUND

1. Technical Field

Example embodiments relate to a semiconductor device and to a method of manufacturing the semiconductor device. More particularly, example embodiments relate to a semiconductor device including a contact pad to electrically connect a source/drain of a transistor to a lower electrode of a capacitor and to a method of manufacturing the same.

2. Discussion of the Related Art

Semiconductor devices are now more highly integrated due to the decrease in a design rule thereof. Accordingly, as a result, the size of a unit cell of the semiconductor device has been significantly reduced.

A unit memory cell of DRAM may include at least one transistor and at least one capacitor. As the DRAM cell is highly integrated, the size of a contact pad for electrically connecting a source/drain of the transistor to the capacitor may be reduced. Accordingly, because the contact area between the contact pad and the capacitor is reduced, the contact resistance between a lower electrode of the capacitor and the contact pad may be significantly increased and further an align margin of the contact pad may be reduced.

SUMMARY

Example embodiments may provide a semiconductor device capable of reducing a contact resistance between a lower electrode and a contact pad and ensuring an align margin of the contact pad.

Example embodiments may also provide a method of manufacturing the semiconductor device.

According to some example embodiments, a semiconductor device includes an insulation interlayer and an etch stop layer sequentially stacked on a substrate wherein a lower structure including a first contact pad is formed. A second contact pad penetrates the insulation interlayer and the etch stop layer and is connected to the first contact pad. The second contact pad protruding from the etch stop layer. A pad spacer is provided between the second contact pad and the insulation interlayer. A lower electrode is provided on the etch stop layer and is connected to the second contact pad. A dielectric layer and an upper electrode are sequentially provided on the lower electrode.

In an example embodiment, the second contact pad may include an upper portion protruding from the etch stop layer. The lower electrode may surround the upper portion of the second contact pad. The upper portion of the second contact pad may be exposed by the pad spacer.

In another example embodiment, the semiconductor device may further include a landing pad provided on the insulation interlayer to contact the second contact pad. The landing pad having a cross-sectional area greater than that of the second contact pad. The lower electrode may be provided on the landing pad.

According to some example embodiments, a semiconductor device include a first insulation interlayer, an etch stop layer and a second insulation interlayer sequentially stacked on a substrate wherein a lower structure including a first contact pad is formed. A second contact pad penetrates the first insulation interlayer, the etch stop layer and the second insulation interlayer and contacts the first contact pad. A pad spacer is provided between the second contact pad and the first insulation interlayer and the second insulation interlayer. A landing pad is provided on the second insulation interlayer and contacts the second contact pad. The landing pad having a cross-sectional area greater than that of the second contact pad. A lower electrode is provided which contacts the landing pad. A dielectric layer and an upper electrode are sequentially provided on the lower electrode.

According to some example embodiments, in a method of manufacturing a semiconductor device, an insulation interlayer and an etch stop layer are sequentially formed on a substrate wherein a lower structure including a first contact pad is formed. A second contact pad is formed to penetrate the insulation interlayer and the etch stop layer and is connected to the first contact pad. The second contact pad protrudes from the etch stop layer. A pad spacer is formed between the second contact pad and the insulation interlayer. A lower electrode is formed connected to the second contact pad. A dielectric layer and an upper electrode are formed on the lower electrode.

In an example embodiment, the forming of the second contact pad and the pad spacer may include forming a second insulation interlayer on the etch stop layer, partially etching the first insulation interlayer, the etch stop layer and the second insulation interlayer to form a contact hole that exposes the first contact hole, forming a spacer on a sidewall of the contact hole, filling the contact hole with a conductive material to form the second contact pad that is connected to the first contact pad, forming a mold layer on the second insulation interlayer, partially etching the second insulation interlayer and the mold layer to form an opening that exposes upper portions of the second contact pad and the spacer, and removing the upper portion of the spacer exposed by the opening to form the pad spacer.

In this case, the forming of the lower electrode may include forming the lower electrode along a sidewall and a bottom face of the opening to surround the upper portion of the second contact pad, and removing the second insulation interlayer and the mold layer.

In an example embodiment, the opening may have a cross-sectional area greater than that of the second contact pad.

In another example embodiment, the forming of the second contact pad and the pad spacer may include forming a second insulation interlayer on the etch stop layer, partially etching the first insulation interlayer, the etch stop layer and the second insulation interlayer to form a contact hole that exposes the first contact hole, forming a spacer on a sidewall of the contact hole, filling the contact hole with a conductive material to form the second contact pad that is connected to the first contact pad, removing the second insulation interlayer to expose upper portions of the second contact pad and the spacer, and removing the exposed upper portion of the spacer to form the pad spacer.

In this case, the forming of the lower electrode may include forming a mold layer on the etch stop layer, partially etching the mold layer to form an opening that exposes the upper portion of the second contact pad, forming the lower electrode along a sidewall and a bottom face of the opening to contact the upper portion of the second contact pad, and removing the second insulation interlayer and the mold layer.

In another example embodiment, the opening may have a cross-sectional area greater than that of the second contact pad.

According to some example embodiments, in a method of manufacturing a semiconductor device, a first insulation interlayer, an etch stop layer and a second insulation interlayer are sequentially foiled on a substrate wherein a lower structure including a first contact pad is formed. A second contact pad is formed that penetrates the first insulation interlayer, the etch stop layer and the second insulation interlayer and is connected to the first contact pad. A pad spacer is formed between the second contact pad and the first insulation interlayer and the second insulation interlayer. A third insulation interlayer is formed on the second insulation interlayer. A landing pad is foamed that penetrates the third insulation interlayer and is connected to the second contact pad. A lower electrode is formed contacting the landing pad. A dielectric layer and an upper electrode are formed on the lower electrode.

In still another example embodiment, the landing pad may have a cross-sectional area greater than that of the second contact pad.

As mentioned above, a pad spacer may surround a contact pad that is connected to a lower electrode. Accordingly, a short between the contact pad and a bit line may be prevented and a process margin of the contact pad may be ensured.

Further, as the lower electrode contacts a protruding upper portion of the contact pad, the contact resistance of the lower electrode and the contact pad may be reduced and an align margin between the lower electrode and the contact pad may be ensured.

BRIEF DESCRIPTION OF THE DRAWINGS

Example embodiments will be more clearly understood from the following detailed description taken in conjunction with the accompanying drawings. FIGS. 1 to 5D represent non-limiting, example embodiments as described herein.

FIG. 1 is a cross-sectional view illustrating a semiconductor device in accordance with an example embodiment.

FIG. 4 is a cross-sectional view illustrating a semiconductor device in accordance with an example embodiment.

FIGS. 5A to 5D are cross-sectional views illustrating a method of manufacturing a semiconductor device in FIG. 4.

DETAILED DESCRIPTION OF THE EXAMPLE EMBODIMENTS

Figure 1:
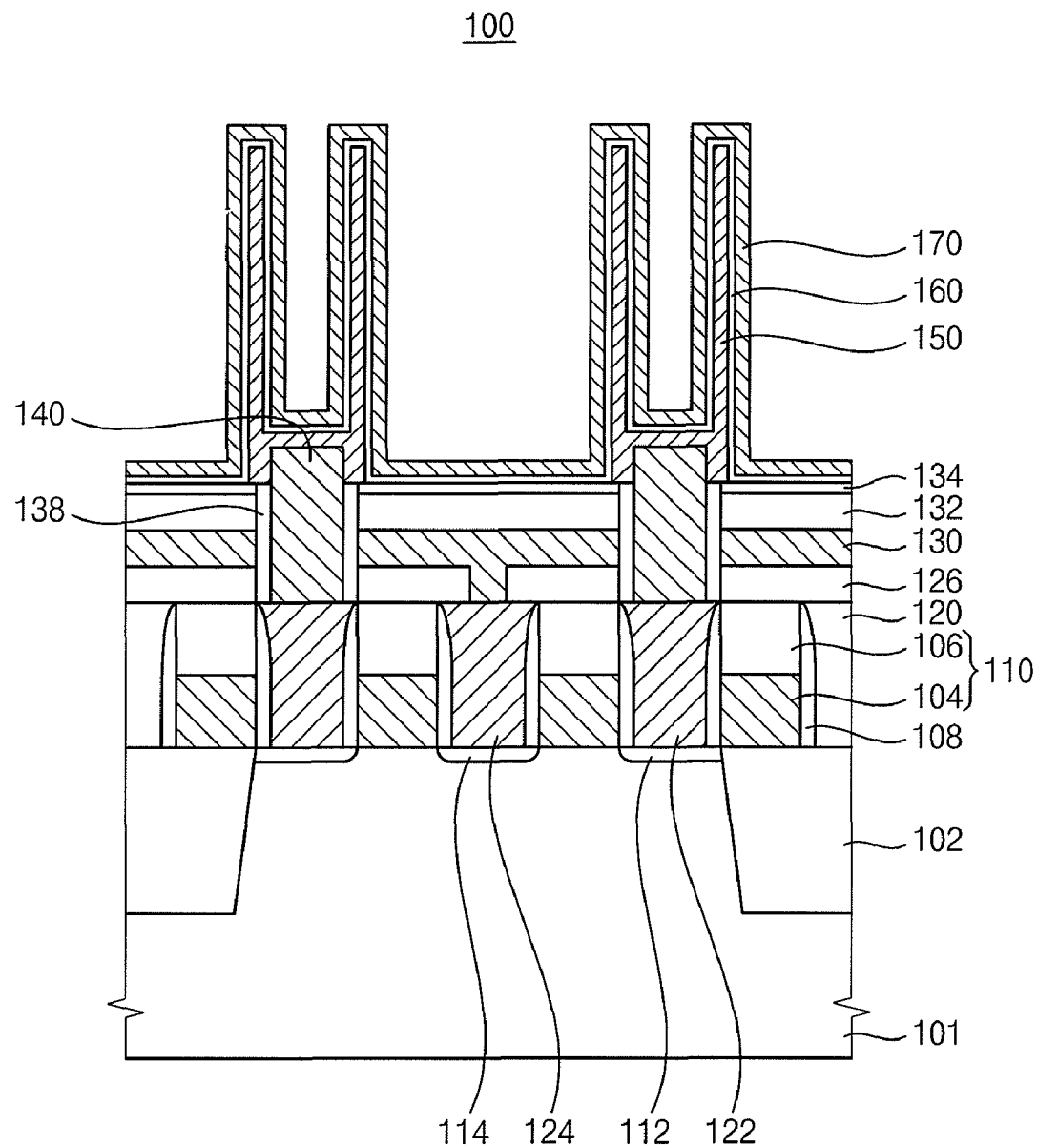

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular fauns "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating a semiconductor device in accordance with an example embodiment.

Referring to FIG. 1, a semiconductor device 100 includes a semiconductor substrate 101, a gate structure 110, a gate spacer 108, a first insulation interlayer 120 having a first contact pad 122 and a second contact pad 124 foamed therein, a second insulation interlayer 126, a bit line 130, a third insulation interlayer 132, an etch stop layer 134, a pad spacer 138, a third contact pad 140, a lower electrode 150, a dielectric layer 160 and an upper electrode 170.

The semiconductor substrate 101 includes an isolation layer 102 that defines an active region and a field region in the substrate 101.

The gate structure 110 includes a gate insulation layer pattern, a gate electrode 104 and a gate mask 106 that are stacked on one another. The gate insulation layer pattern may be formed using, for example, a silicon oxide layer, or, for example, a thin layer having a dielectric constant higher than the silicon oxide layer. The gate electrode 104 may have, for example, a stacked structure of a doped polysilicon layer and a metal layer. The gate mask may be formed using, for example, a nitride such as silicon nitride.

The gate spacer 108 is provided on both sidewalls of the gate structure 110. The gate spacer 108 may include, for example, silicon nitride.

The semiconductor substrate 101 includes a first contact region 112 and a second contact region in both sides of the gate structures 110 serving as source/drain regions. The first contact region 112 may be referred to as a capacitor contact region to be connected to a first contact pad 122. The second contact region 114 may be referred to as a bit line contact region to be connected to the second contact pad 124.

Transistors including the gate structure 110 and the first and second contact regions 112 and 114 are formed on the semiconductor substrate 101.

The first insulation interlayer 120 is provided to cover the transistors on the substrate 101. The first insulation interlayer 120 may be formed using, for example, an insulating material including oxide. For example, the insulation interlayer 120 may include boron phosphorus silicate glass (BPSG), phosphor silicate glass (PSG), spin-on-glass (SOG), undoped silicate glass (USG), plasma enhanced-tetraethyl orthosilicate (PE-TEOS), high density plasma-chemical vapor deposition (HDP-CVD) oxide, etc. The first insulation interlayer 120 may have a height identical to that of the gate mask 106.

The first contact pad 122 and the second contact pad 124 penetrate the first insulation interlayer 120 to contact the first contact region 112 and the second contact region 114, respectively. The first contact pad 122 is electrically connected to the capacitor contact region, and the second contact pad 124 is electrically connected to the bit line contact region. The first contact pad 112 and the second contact pad 124 may include, for example, polysilicon doped with a high impurity concentration, metal, conductive metal nitride, etc.

The second insulation interlayer 126 is provided on the first insulation interlayer 120 having the first and second contact pads 122 and 124 formed therein. The second insulation interlayer 126 may electrically insulate the first contact pad 122 from the bit line 130.

The bit line 130 is provided in the second insulation interlayer 126 to be electrically connected to the second contact pad 124. The bit line 130 may include, for example, a first layer of metal/metal composite and a second layer of metal. For example, the first layer may include titanium/titanium nitride (Ti/TiN), and the second layer may include tungsten (W).

The third insulation interlayer 132 is provided on the second insulation interlayer 126 having the bit line 130 formed therein. The third insulation interlayer 132 may be formed using, for example, an insulating material including oxide. For example, the third insulation interlayer 132 may include BPSG, PSG, SOG, USG, PE-TEOS, HDP-CVD oxide, etc.

The etch stop layer 134 is provided on the third insulation interlayer 132. The etch stop layer 134 may include, for example, a material having an etch selectivity with respect to the third insulation interlayer 132. For example, the etch stop layer 134 may include a nitride such as silicon nitride.

The third contact pad 140 penetrates the etch stop layer 134, the third insulation interlayer 132 and the second insulation interlayer 126 to be electrically connected to the first contact pad 122. The third contact pad 140 may connect the first contact pad 122 to the lower electrode 150. The third contact pad 140 may include, for example, doped polysilicon.

The pad spacer 138 is provided on the sidewall of the third contact pad 140. The height of the pad spacer 138 may be identical to the sum of those of the etch stop layer 134, the third insulation interlayer 132 and the second insulation interlayer 126. The pad spacer 138 may include, for example, silicon nitride. The pad spacer 138 may prevent a short between the third contact pad 140 and the bit line 130. Accordingly, a process margin of the third contact pad 140 may be ensured.

The lower electrode 150 may be provided to surround an upper portion of the third contact pad 140 protruding from the etch stop layer 134, to thereby increase the contact area between the lower electrode 150 and the third contact pad 140. Accordingly, the contact resistance of the lower electrode 150 and the third contact pad 140 may be reduced and the align margin between the lower electrode 150 and the third contact pad 140 may be ensured.

The lower electrode may be formed using different material from the third contact pad 140. The lower electrode 150 may include, for example, metal or material having metal. The lower electrode 150 may include, for example, titanium, titanium nitride, etc. The lower electrode 150 may be, for example, a multi-layer of titanium and titanium nitride. For example, the lower electrode 150 may have a titanium/titanium nitride structure.

In the case that the lower electrode 150 is formed using metal or material having metal without polysilicon material, a depletion layer in an interface between the lower electrode 150 and the dielectric layer 160 may be not generated to increase the capacitance of a resultant capacitor.

The dielectric layer 160 is provided to have a uniform thickness on the lower electrode 150 and the etch stop layer 134. The dielectric layer 160 may be formed using, for example, a metal oxide having a high dielectric constant. Examples of the metal oxide may include but are not limited to aluminum oxide, hafnium oxide, etc.

An upper electrode 170 is provided on the dielectric layer 160. The upper electrode 170 may include, for example, metal or material having metal. Alternatively, the upper electrode 170 may have, for example, a multi-layer structure including metal or material having metal and polysilicon.

The pad spacer 138 of the semiconductor device 100 may prevent a short between the third contact pad 140 and the bit line 130. Accordingly, a process margin for the third contact pad 140 may be ensured.

Further, as the lower electrode 150 surrounds the upper portion of the third contact pad 140 protruding from the etch stop layer 134, the contact area between the lower electrode 150 and the third contact pad 140 may be increased. Accordingly, the contact resistance of the lower electrode 150 and the third contact pad 140 may be reduced and an align margin between the lower electrode 150 and the third contact pad 140 may be ensured.

FIGS. 2A to 2H are cross-sectional views illustrating a method of manufacturing a semiconductor device in FIG. 1 in accordance with an example embodiment.

Figure 2A:
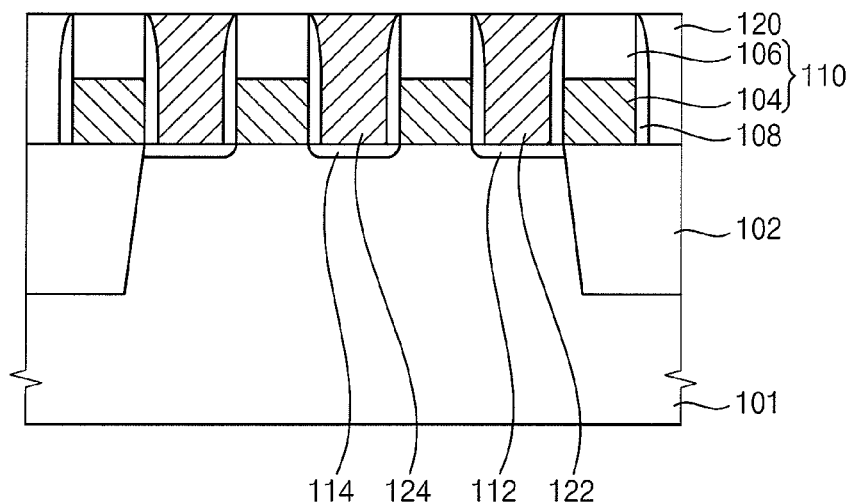
FIGS. 2A to 2H are cross-sectional views illustrating a method of manufacturing a semiconductor device in FIG. 1 in accordance with an example embodiment.

Referring to FIG. 2A, for example, a shallow trench isolation (STI) process is performed on a semiconductor substrate 101 to form an isolation layer 102 in the substrate 101 to define an active region and a field region in the substrate 101.

A gate insulation layer is formed on the substrate 101. For example, the gate insulation layer may be formed by a thermal oxidation process, a chemical vapor deposition process, an atomic layer deposition process, etc. The gate insulation layer may be, for example, a silicon oxide layer, or a thin layer having a dielectric constant higher than the silicon oxide layer.

A first conductive layer and a gate mask are sequentially formed on the gate insulation layer. The first conductive layer may be formed using, for example, doped polysilicon. The first conductive layer may be patterned to be a gate electrode by a following process. Alternatively, the first conductive layer may have, for example, a stacked structure of a doped polysilicon layer and a metal layer.

The gate mask may be formed using a material having a high etch selectivity with respect to a first insulation interlayer to be formed by a following process. For example, when the first insulation interlayer includes an oxide such as silicon oxide, the gate mask may be formed using a nitride such as silicon nitride.

The first conductive layer and the gate insulation layer are sequentially patterned using the gate mask as an etching mask to form gate structures 110. The gate structure 110 includes a gate insulation layer pattern, a gate electrode 104 and a gate mask 106.

After a silicon nitride layer is formed on the substrate 101 including the gate structures 110 formed thereon, the silicon nitride layer is etched by, for example, an anisotropic process to form a gate spacer 108 on both sidewalls of the gate structure 110.

Impurities are implanted into the substrate 101 in both sides of the gate structures 110 using the gate structure 110 as an etching mask. Then, a heat treatment process is performed on the substrate 101 to form a first contact region 112 and a second contact region 114 serving as a source/drain region respectively. The first contact region 112 may be referred to as a capacitor contact region to be connected to a first contact pad 122. The second contact region 114 may be referred to as a bit line contact region to be connected to the second contact pad 124.

Accordingly, a transistor including the gate structure 110 and the first and second contact regions 112 and 114 is formed on the substrate 101.

Then, a first insulation interlayer 120 is formed to cover the transistors on the substrate 101. The first insulation interlayer 120 may be formed using, for example, an insulating material including oxide. For example, the insulation interlayer 120 may include boron phosphorus silicate glass (BPSG), phosphor silicate glass (PSG), spin-on-glass (SOG), undoped silicate glass (USG), plasma enhanced-tetraethyl orthosilicate (PE-TEOS), high density plasma-chemical vapor deposition (HDP-CVD) oxide, etc. The first insulation interlayer 120 may be formed by, for example, a chemical vapor deposition process, a plasma enhanced chemical vapor deposition process, a high density plasma chemical vapor deposition process, an atomic layer deposition process, etc.

The first insulation interlayer 120 is planarized by, for example, a chemical mechanical polishing process. For example, the first insulation interlayer 120 may have a height identical to that of the gate mask 106.

After a second photoresist pattern is formed on the first insulation interlayer 120, a portion of the first insulation interlayer 120 is, for example, anisotropically etched using the second photoresist pattern as an etching mask to form first contact holes that expose the first contact region 112 and the second contact region 114. Some of the first contact holes may expose the first contact regions 112 of the capacitor contact regions and others of the first contact holes may expose the second contact regions 114 of the bit line contact regions.

After the second photoresist pattern is removed by, for example, ashing and/or strip processes, a second conductive layer is foamed to cover the first insulation interlayer 120 and to fill up the first contact holes. The second conductive layer may be formed using, for example, doped polysilicon, metal or conductive metal nitride, etc.

Then, the second conductive layer is removed by, for example, a chemical mechanical polishing process or an etchback process until the upper surface of the first insulation interlayer 120 is exposed, to form the first contact pad 122 and the second contact pad 124 in the first contact holes. The first contact pad 122 is electrically connected to the capacitor contact region, and the second contact pad 124 is electrically connected to the bit line contact region.

Figure 2B:
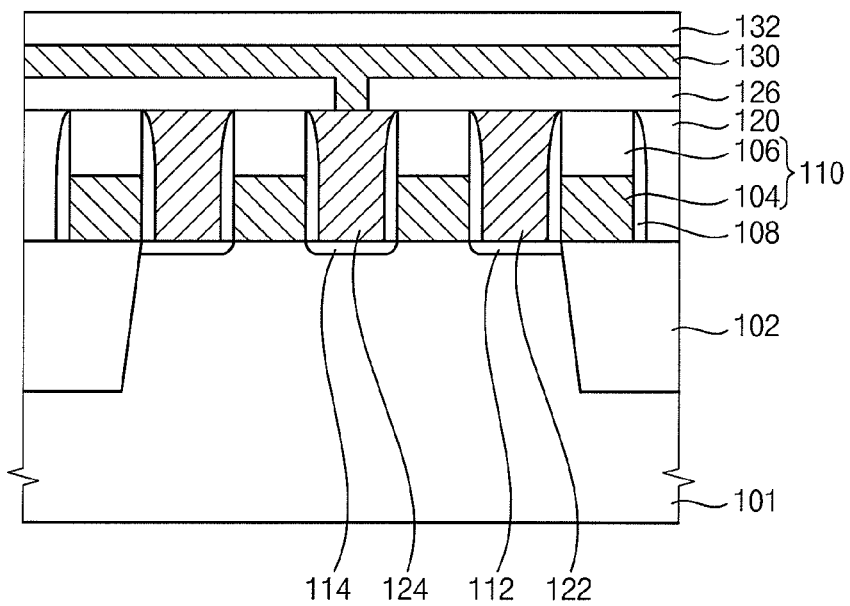

Referring to FIG. 2B, a second insulation interlayer 126 is formed on the first insulation interlayer 126 having the first and second contact pads 122 and 124 formed therein. The second insulation interlayer 126 may electrically insulate the first contact pad 122 from a bit line 130 to be formed by a following process.

Then, an upper surface of the second insulation layer is planarized by, for example, a chemical mechanical polishing process. After a third photoresist pattern is formed on the planarized second insulation interlayer 126, the second insulation interlayer 126 is partially etched using the third photoresist pattern as an etching mask to form a second contact hole that exposes the second contact pad 124 in the second insulation interlayer. The second contact hole may be referred to as a bit line contact hole for electrically connecting the second contact pad and the bit line 130 to be formed by a following process.

After the third photoresist pattern is removed by, for example, an ashing and/or strip processes, a third conductive layer is formed on the second insulation interlayer to fill up the second hole.

The third conductive layer is patterned to form the bit line 130 to be electrically connected to the second contact pad. The bit line 130 may include, for example, a first layer of metal/metal composite and a second layer of metal. For example, the first layer may include titanium/titanium nitride (Ti/TiN), and the second layer may include tungsten (W).

Then, a third insulation interlayer 132 is formed on the second insulation interlayer 126 to cover the bit line 130. The third insulation interlayer 132 may be formed using, for example, an insulating material including oxide. For example, the third insulation interlayer 132 may include BPSG, PSG, SOC, USG, PE-TEOS, HDP-CVD oxide, etc.

Figure 2C:
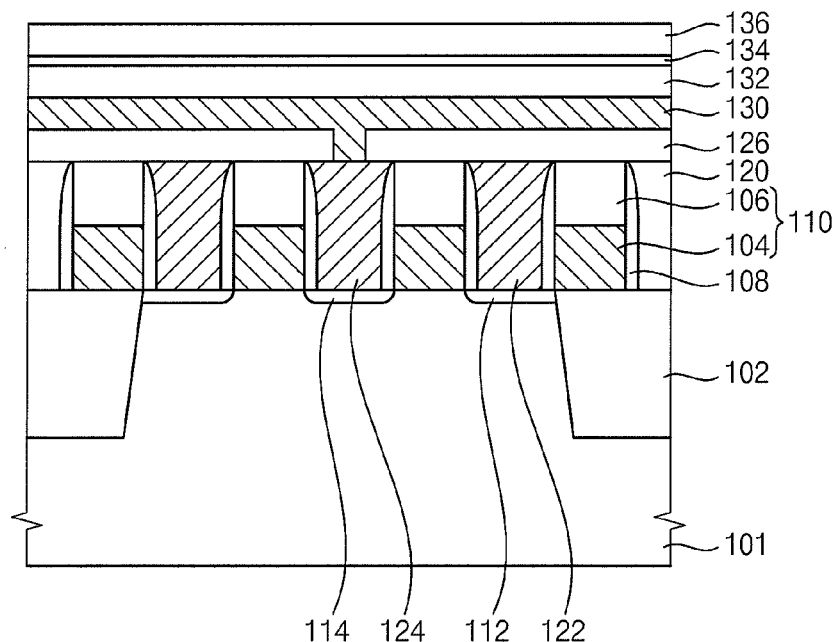

Referring to FIG. 2C, an etch stop layer 134 and a fourth insulation interlayer 136 are formed on the third insulation interlayer 132.

The etch stop layer 134 may be formed using, for example, a material having an etch selectivity with respect to the third insulation interlayer 132 and the fourth insulation interlayer 136. For example, the etch stop layer 134 may be formed using a nitride such as silicon nitride. Alternatively, for example, after the upper surface of the third insulation interlayer 132 is planarized by a chemical mechanical polishing process, an etch-back process or a combination thereof, the etch stop layer 134 may be formed on the planarized third insulation interlayer 132.

The fourth insulation interlayer 136 may be formed using, for example, an insulating material including oxide. For example, the fourth insulation interlayer 136 may include TEOS, HDP-CVD oxide, PSG, USG, BPSG, SOG, etc. For example, the fourth insulation interlayer 136 may be formed using TEOS.

Figure 2D:
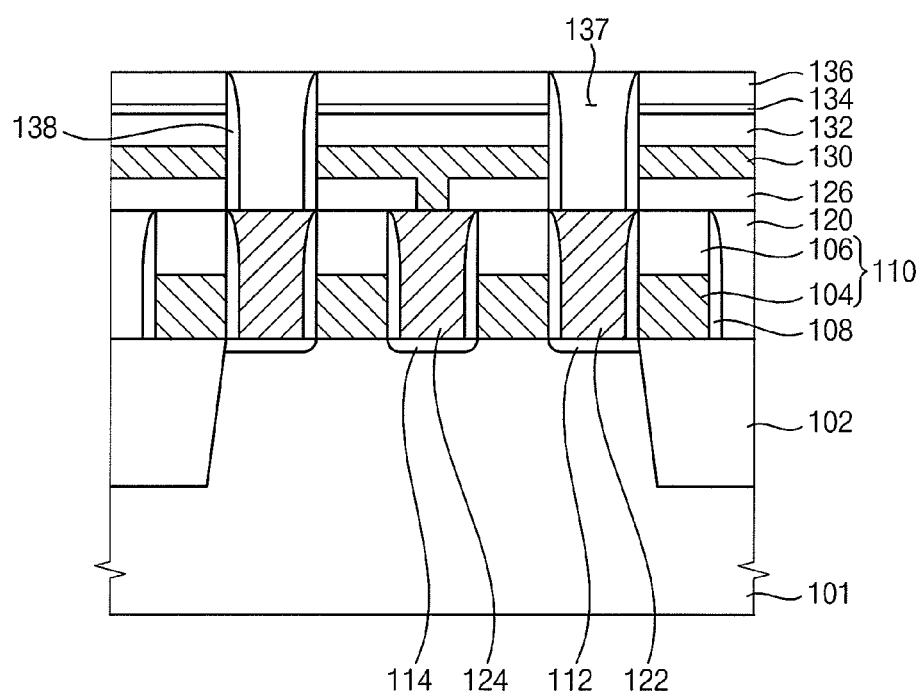
Figure 2E:
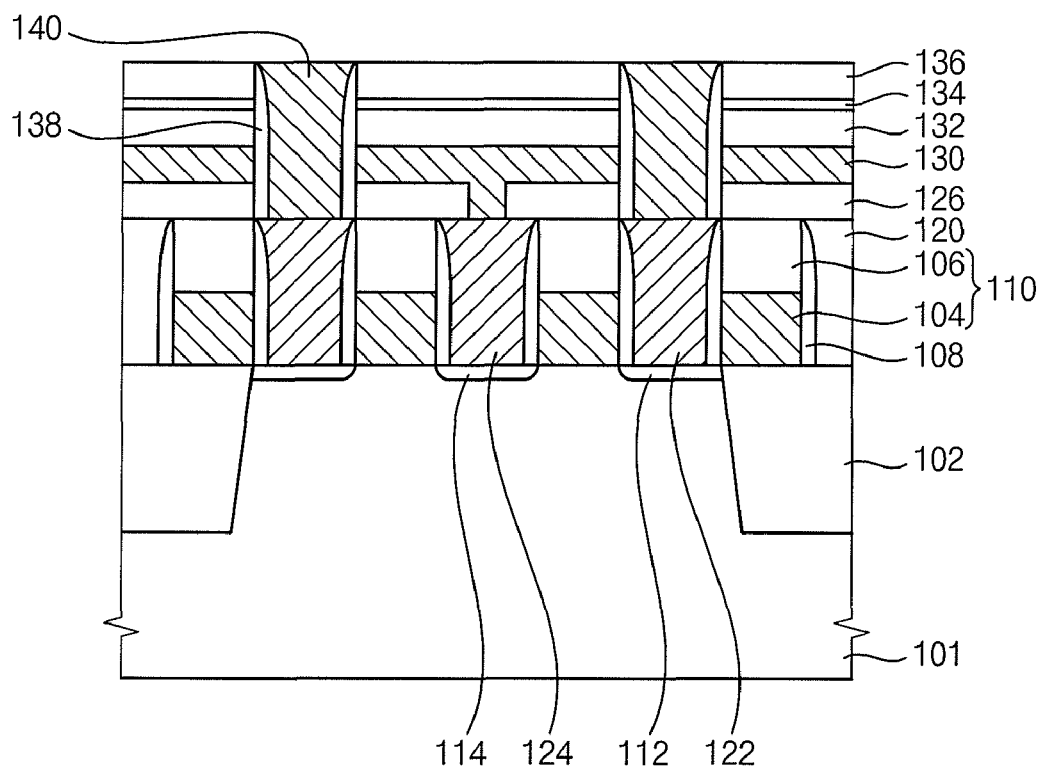

Referring to FIG. 2D, after a fourth photoresist pattern is formed on the fourth insulation interlayer 136, the fourth insulation interlayer 136, the etch stop layer 134, the third insulation interlayer 132 and the second insulation interlayer 126 are partially etched using the fourth photoresist pattern as an etching mask to form third contact holes 137 that expose the first contact pads 122 respectively. The third contact hole 137 may be referred to as a contact pad for a capacitor.

Then, after a silicon nitride layer is formed conformally on the fourth insulation interlayer 136 and the third contact hole 137, the silicon nitride layer is, for example, anisotropically etched to form a pad spacer 138 on a sidewall of the third contact hole 137.

Referring to 2E, after a fourth conductive layer is formed on the fourth insulation interlayer 136 to fill the third contact holes 137, the fourth conductive layer is planarized by, for example, a chemical mechanical polishing process until the fourth insulation interlayer 136 is exposed, to form third contact pads 140 in the third contact holes 137 respectively. For example, the third contact pad 140 may include doped polysilicon to electrically connect the first contact pad 122 and a lower electrode to be formed by a following process.

The pad spacer 138 may prevent a short between the third contact pad 140 and the bit line 130. Accordingly, a process margin of the third contact hole 137 and the third contact pad 140 may be ensured.

Figure 2F:
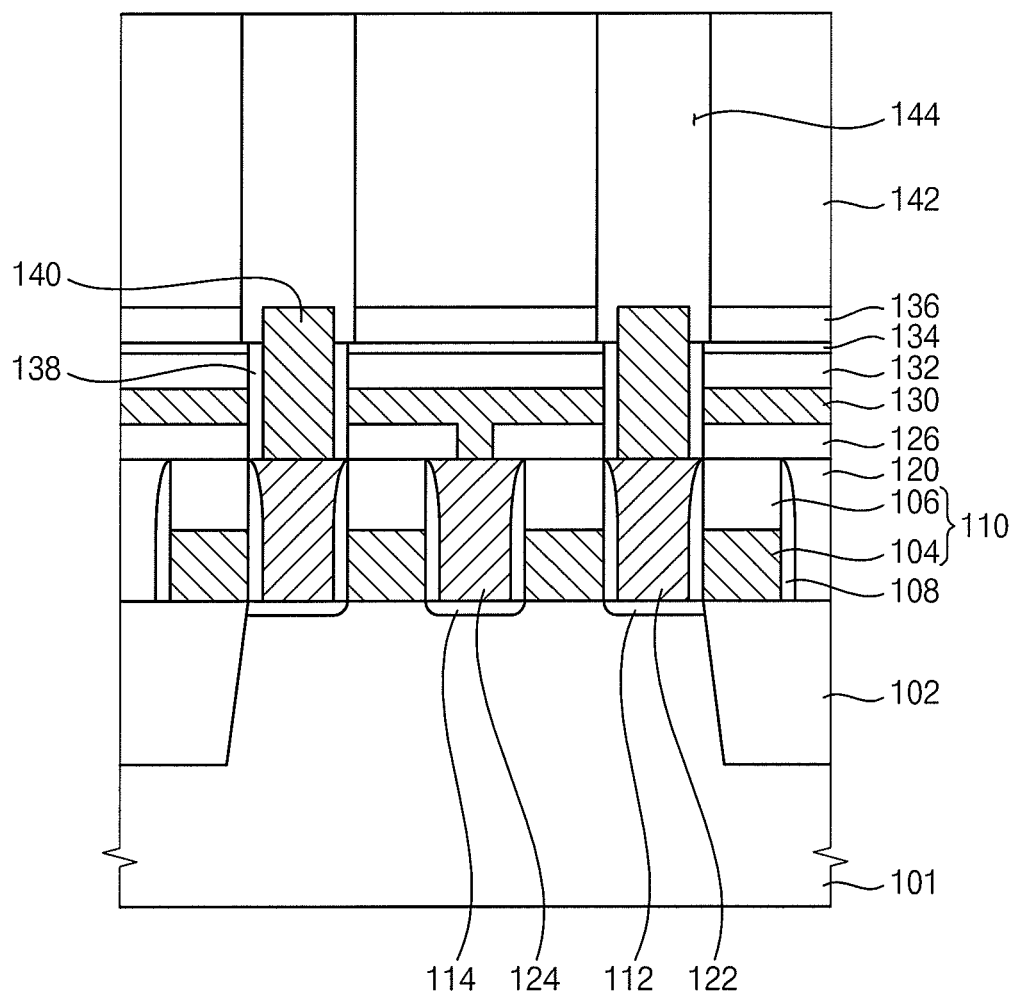

Referring to FIG. 2F, a mold layer 142 for forming a lower electrode is formed on the fourth insulation interlayer 136. For example, the mold layer 142 may be formed using an oxide. Examples of the oxide may include but are not limited to TEOS, HDP-CVD oxide, PSG, USG, BPSG, SOG, etc. The mold layer 142 may include, for example, at least two oxide layers of a stacked structure. The two oxide layers may have different etch rates. Accordingly, a sidewall shape of a lower electrode of a capacitor to be formed by a following process may vary due to the different etch rates of the at least two oxide layers.

Further, the thickness of the mold layer 142 may be determined to meet a required capacitance of a resultant capacitor. That is, because the height of the capacitor depends on the thickness of the mold layer 142, the thickness of the mold layer 142 may be controlled to form the capacitance having a required capacitance.

The mold layer 142 and the fourth insulation interlayer 136 are partially etched to form an opening 144. The opening 144 may have a cross-sectional area greater than that of the third contact pad 140. Accordingly, upper portions of the third contact pad 140 and the pad spacer 138 are exposed by the opening 144.

The upper portion of the pad spacer 138 exposed by the opening 144 is etched by an etch process. The etch process may be performed using, for example, a phosphoric acid solution. As the upper portion of the pad spacer 138 is etched, the upper portion of the third contact pad 140 is exposed such that the upper portion of the third contact pad 140 protrudes from a bottom face of the opening 144.

Figure 2G:
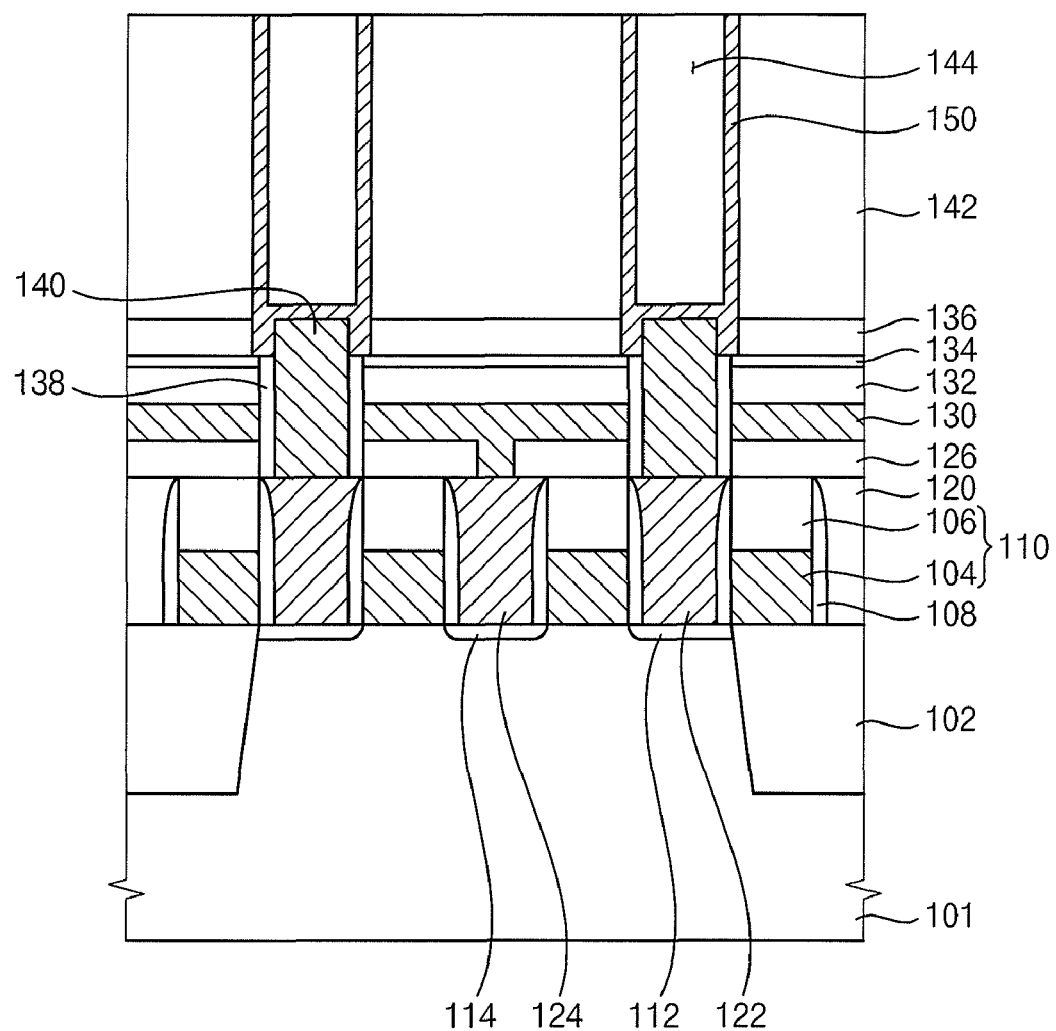

Referring to FIG. 2G, a fifth conductive layer for a lower electrode is formed conformally on a sidewall and the bottom face of the opening 144 and an upper surface of the mold layer 142. The fifth conductive layer may be formed along inner faces of the opening 144 having a high aspect ratio. Accordingly, the fifth conductive layer may be formed using a material having beneficial step coverage characteristics. Further, the fifth conductive layer may have a thin thickness not to completely fill the opening 144. For example, the fifth conductive layer may be formed by a chemical vapor deposition process, a cyclic chemical vapor deposition process, an atomic layer deposition process, etc.

The fifth conductive layer is planarized by, for example, a chemical mechanical polishing process until the upper surface of the mold layer 142 is exposed, to form a lower electrode 150. The lower electrode 150 may be formed using different material from the third contact pad 140. The lower electrode 150 may include, for example, metal or material having metal. The lower electrode 150 may include, for example, titanium, titanium nitride, etc. The lower electrode 150 may be, for example, a multi-layer structure of titanium and titanium nitride. For example, the lower electrode 150 may have a titanium/titanium nitride structure.

In the case that the lower electrode 150 is formed using metal or material having metal without polysilicon material, a depletion layer in an interface between the lower electrode 150 and a dielectric layer to be formed by a following process may be not generated to increase a capacitance of a resultant capacitor.

The lower electrode 150 is formed to surround the upper portion of the third contact pad 140, to thereby increase a contact area between the lower electrode 150 and the third contact pad 140. Accordingly, the contact resistance of the lower electrode 150 and the third contact pad 140 may be reduced and an align margin between the lower electrode 150 and the third contact pad 140 may be ensured.

Figure 2H:
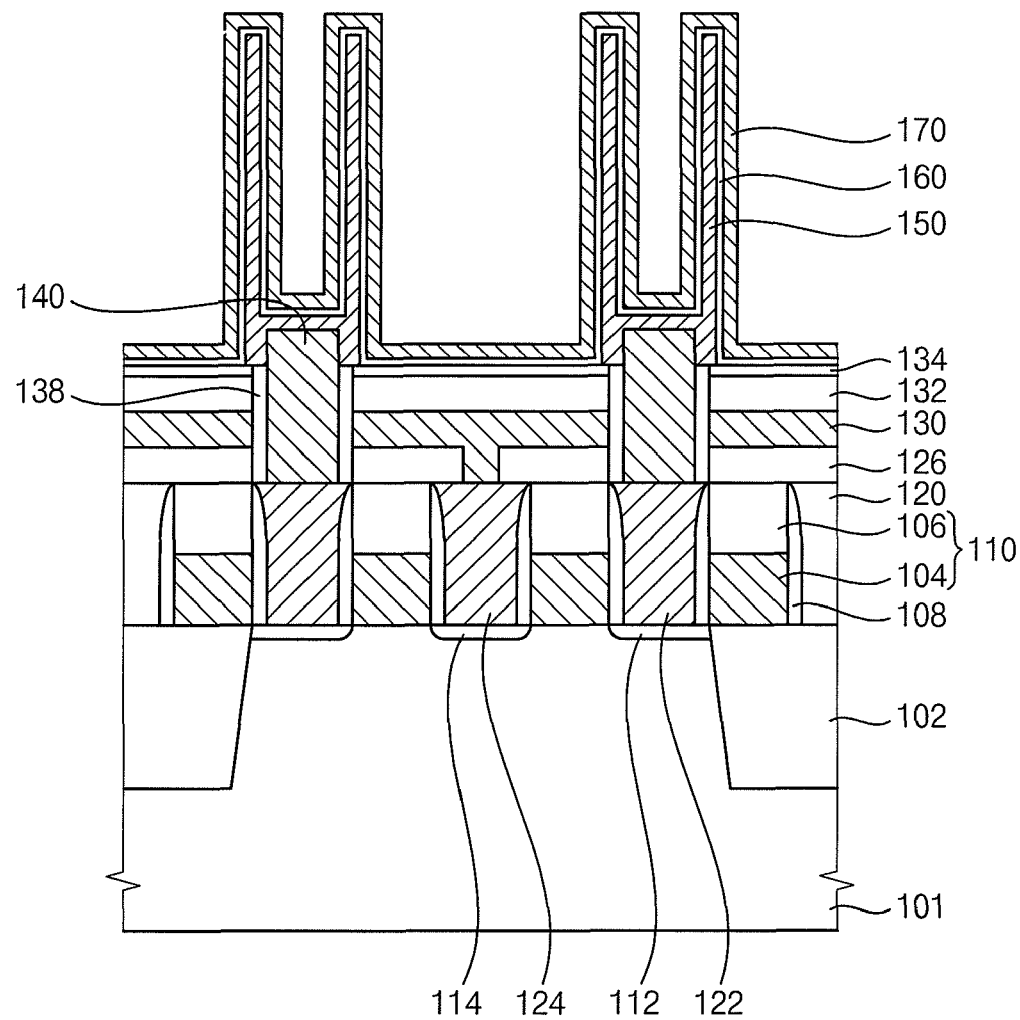

Referring to FIG. 2H, the mold layer 142 and the fourth insulation interlayer 136 are removed by, for example, a wet etch process using an etching solution. When the mold layer 142 and the fourth insulation interlayer 136 include silicon oxide, the mold layer 142 and the fourth insulation interlayer 136 may be removed together by, for example, a wet etch process using a LAL solution having water, hydrogen fluoride and ammonium bifluoride. The LAL solution may further include a metal corrosion inhibitor for preventing corrosion of the lower electrode and a surfactant for preventing re-adsorpotion of oxide.

A dielectric layer 160 is formed to have a uniform thickness on the lower electrode 150 and the etch stop layer 134. The dielectric layer 160 may be formed using, for example, a metal oxide having a high dielectric constant. Examples of the metal oxide may include but are not limited to aluminum oxide, hafnium oxide, etc.

An upper electrode 170 is formed on the dielectric layer 160. The upper electrode 170 may be formed using, for example, metal or material having metal. Alternatively, the upper electrode 170 may have, for example, a multi layer including metal or material having metal and polysilicon. Thus, the above processes are performed to complete a semiconductor device 100.

The pad spacer 138 may prevent a short between the third contact pad 140 and the bit line 130. Accordingly, a process margin for the third contact pad 140 may be ensured.

Further, as the lower electrode 150 surrounds the upper portion of the third contact pad 140 protruding from the etch stop layer 134, the contact area between the lower electrode 150 and the third contact pad 140 may be increased. Accordingly, the contact resistance of the lower electrode 150 and the third contact pad 140 may be reduced and an align margin between the lower electrode 150 and the third contact pad 140 may be ensured.

FIGS. 3A to 3E are cross-sectional views illustrating a method of manufacturing a semiconductor device in FIG. 1 in accordance with another example embodiment.

Figure 3A:
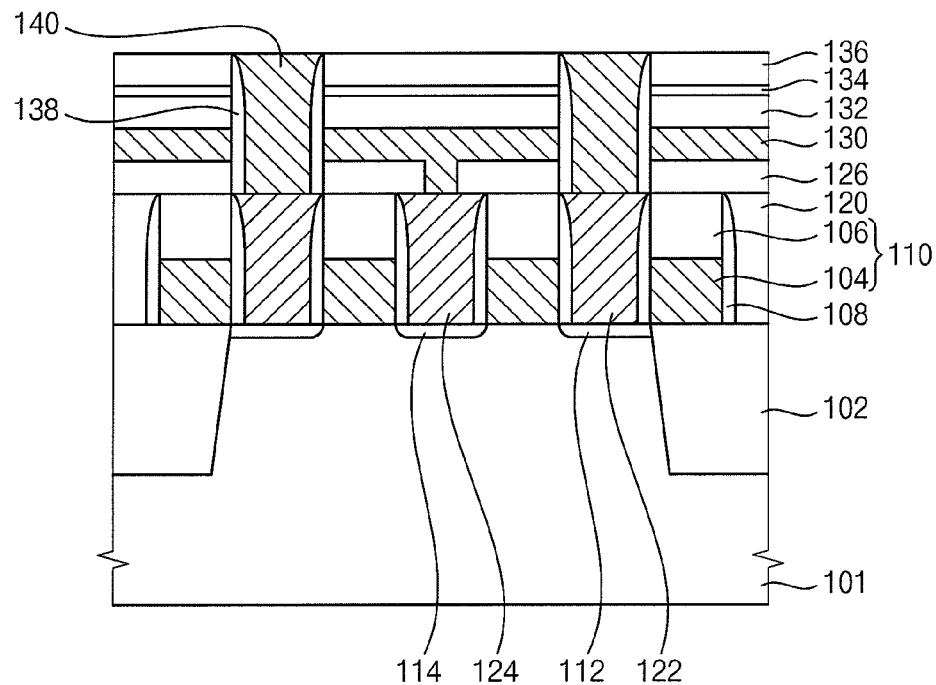
FIGS. 3A to 3E are cross-sectional views illustrating a method of manufacturing a semiconductor device in FIG. 1 in accordance with an example embodiment.

Referring to FIG. 3A, a gate structure 110, a gate spacer 108, a first insulation interlayer 120, a first contact pad 122, a second contact pad 124, a second insulation interlayer 126, a bit line 130, a third insulation interlayer 132, an etch stop layer 134, a fourth insulation interlayer 136, a pad spacer 138 and a third contact pad 140 are formed on a semiconductor substrate 101.

The above processes are substantially the same as the processes described with reference to FIGS. 2A to 2E, and thus any further explanations with respect to the same processes will be omitted.

Figure 3B:
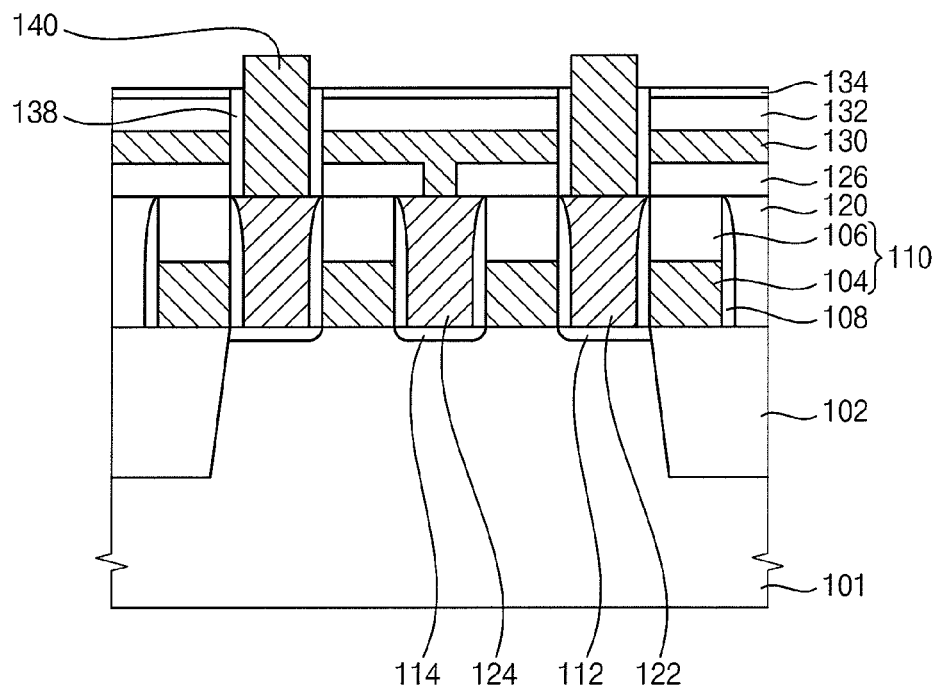

Referring to FIG. 3B, the fourth insulation interlayer 136 is removed by an etch process. Accordingly, upper portions of the third contact pad 140 and the pad spacer 138 are exposed to protrude from the etch stop layer 134.

The upper portion of the pad spacer 138 protruding form the etch stop layer 134 is etched by an etch process. The etch process may be performed using, for example, a phosphoric acid solution. As the upper portion of the pad spacer 138 is etched, the upper portion of the third contact pad 140 is exposed such that the upper portion of the third contact pad 140 protrudes from the etch stop layer a bottom face of the opening 144.

Figure 3C:
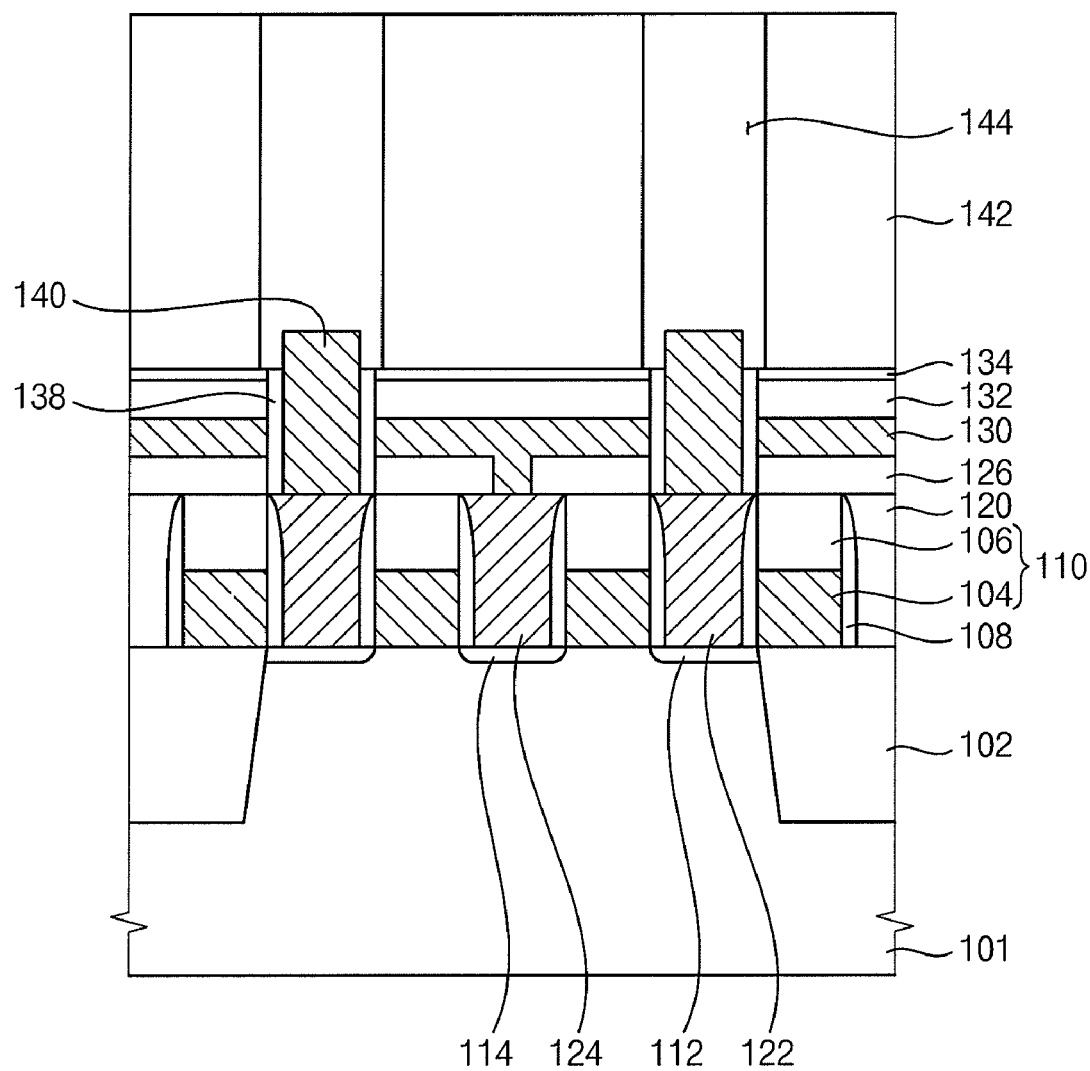

Referring to FIG. 3C, a mold layer for forming a lower electrode is formed on the etch stop layer 134, the pad spacer 138 and the third contact pad 140. For example, the mold layer 142 may be formed using an oxide. Examples of the oxide may include but are not limited to TEOS, HDP-CVD oxide, PSG, USG, BPSG, SOG, etc. The mold layer 142 may include, for example, at least two oxide layers of a stacked structure. The two oxide layers may have different etch rates. Accordingly, a sidewall shape of a lower electrode of a capacitor to be formed by a following process may vary due to the different etch rates of the at least two oxide layers.

Further, the thickness of the mold layer 142 may be determined to meet a required capacitance of a resultant capacitor. That is, because the height of the capacitor depends on the thickness of the mold layer 142, the thickness of the mold layer 142 may be controlled to form the capacitance having a required capacitance.

The mold layer 142 is partially etched to form an opening 144. The opening 144 may have a cross-sectional area greater than that of the third contact pad 140. Accordingly, upper portions of the third contact pad 140 and the pad spacer 138 are exposed by the opening 144.

Figure 3D:
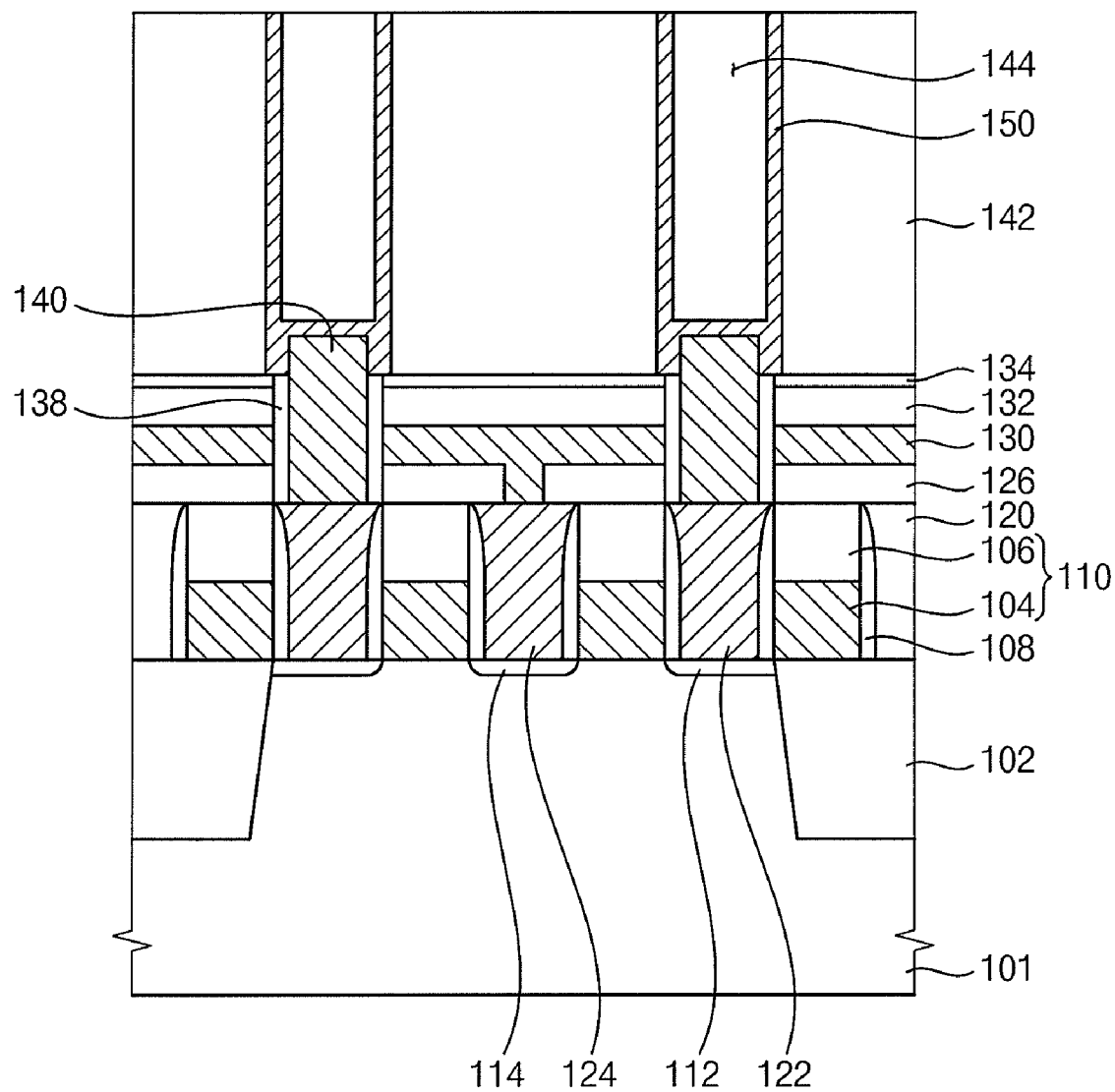

Referring to FIG. 3D, a fifth conductive layer for a lower electrode is formed conformally on a sidewall and the bottom face of the opening 144 and an upper surface of the mold layer 142. Then, the fifth conductive layer is planarized by, for example, a chemical mechanical polishing process until the upper surface of the mold layer 142 is exposed, to form a lower electrode 150.

Figure 3E:
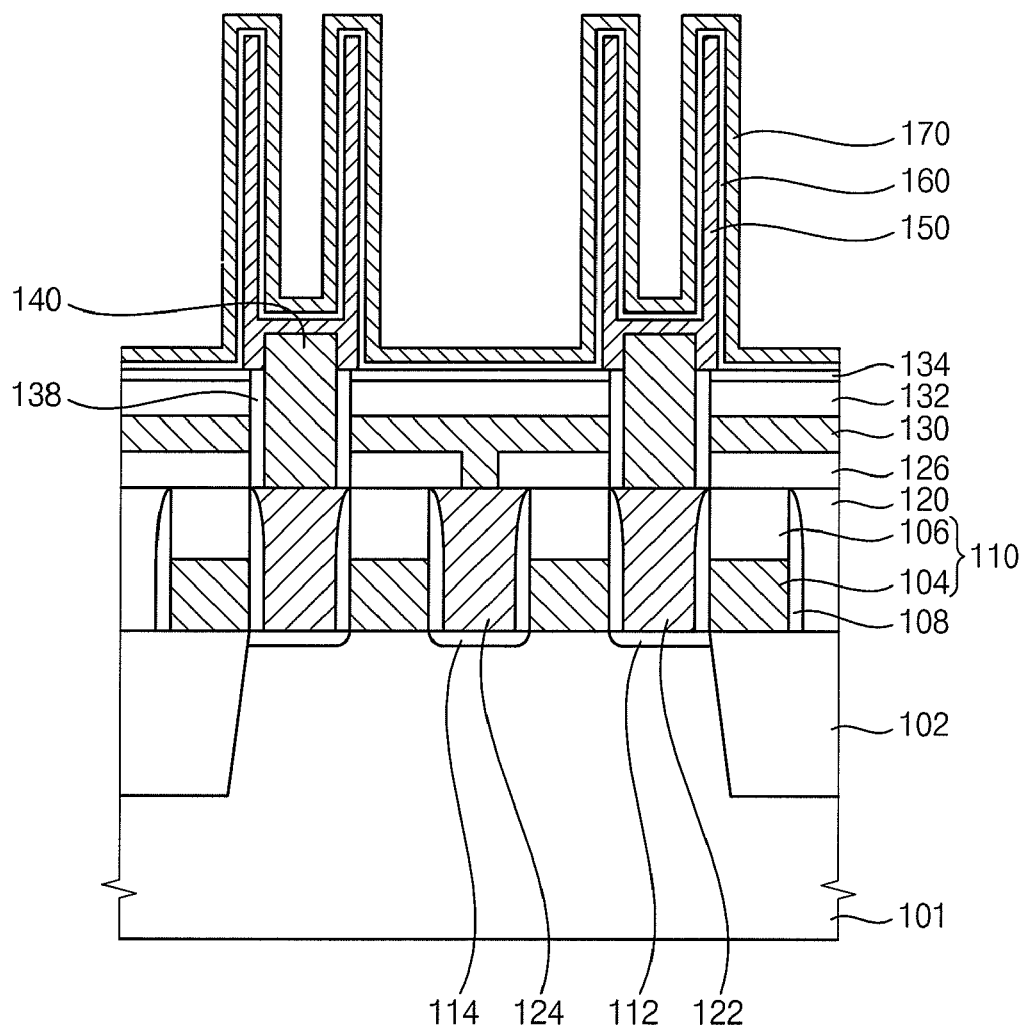

Referring to FIG. 3E, the mold layer 142 is removed by, for example, a wet etch process using an etching solution. After a dielectric layer 160 is formed to have a uniform thickness on the lower electrode 150 and the etch stop layer 134, an upper electrode 170 is formed on the dielectric layer 160.

The above processes in connection with FIGS. 3D to 3E are substantially the same as the processes described with reference to FIGS. 2G to 2H, except for removing only the mold layer 142 using the etching solution.

Through the above processes, a semiconductor device 100 is completed.

The pad spacer 138 may prevent a short between the third contact pads 140 and the bit line 130. Accordingly, a process margin for the third contact pad 140 may be ensured.

Further, as the lower electrode 150 surrounds the upper portion of the third contact pad 140 protruding from the etch stop layer 134, the contact area between the lower electrode 150 and the third contact pad 140 may be increased. Accordingly, the contact resistance of the lower electrode 150 and the third contact pad 140 may be reduced and an align margin between the lower electrode 150 and the third contact pad 140 may be ensured.

Figure 4:
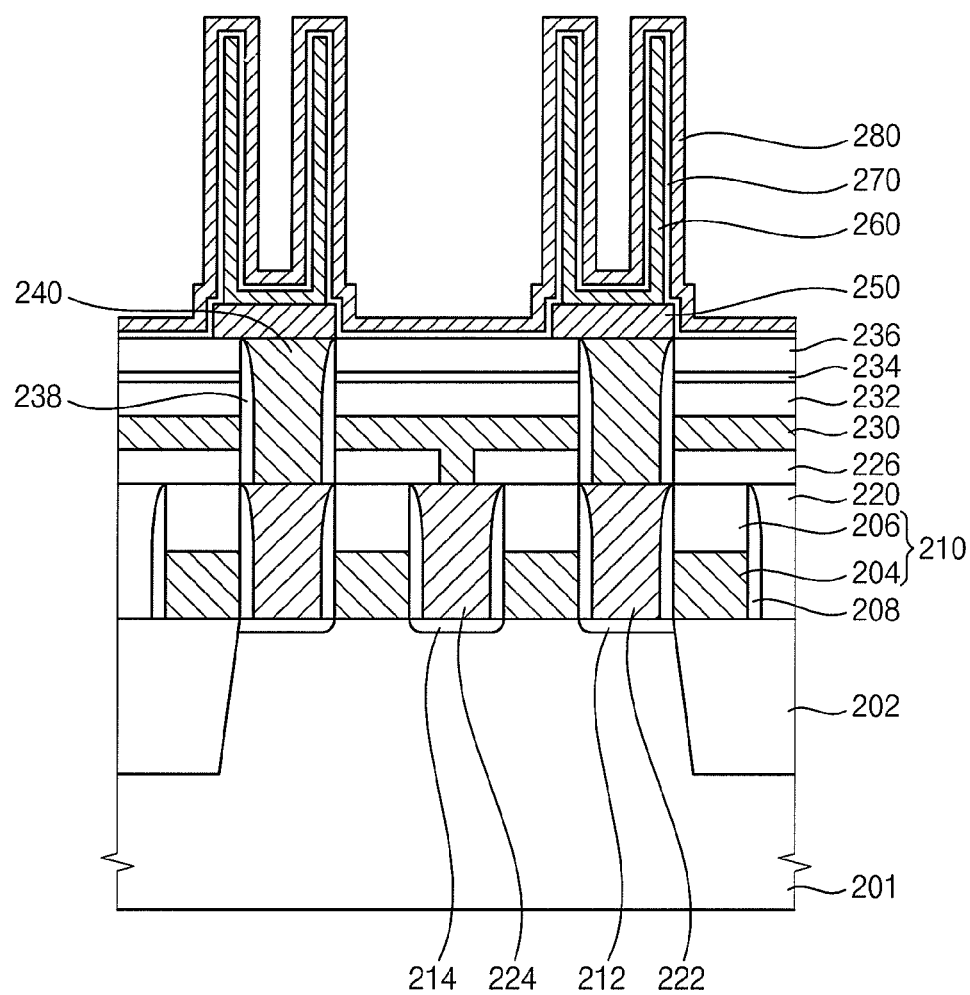

FIG. 4 is a cross-sectional view illustrating a semiconductor device in accordance with a still another example embodiment.

Referring to FIG. 4, a semiconductor device 200 includes a semiconductor substrate 201, a gate structure 210, a gate spacer 208, a first insulation interlayer having a first contact pad 222 and a second contact pad 224 formed therein, a second insulation interlayer 226, a bit line 230, a third insulation interlayer 232, an etch stop layer 234, a fourth insulation interlayer 236, a pad spacer 238, a third contact pad 240, a landing pad 250, a lower electrode 260, a dielectric layer 270 and an upper electrode 280.

The semiconductor device of the present embodiment is substantially the same as in the semiconductor device described in connection with FIG. 1, except that the fourth insulation interlayer 236 is further provided and the landing pad 250 is further provided between the third contact pad 240 and the lower electrode 260. And thus, any further explanations with respect to the same or like parts will be omitted.

The fourth insulation interlayer 236 is provided on the etch stop layer 234. Accordingly, the third contact pad 240 penetrates the fourth insulation interlayer 236, the etch stop layer 234, the third insulation interlayer 232 and the second insulation interlayer 226 to be connected to the first contact pad 222. The pad spacer 238 is provided on a sidewall of the third contact pad 240.

The landing pad 250 may have a cross-sectional area greater than the third contact pad 240. The landing pad 250 may include, for example, doped polysilicon. Accordingly, the contact area between the lower electrode 260 and the landing pad 250 may be increased to thereby reduce the contact resistance of the lower electrode 260 and the landing pad 250 and ensure an align margin between the lower electrode 260 and the landing pad 250.

Further, the pad spacer 238 of the semiconductor device 200 may prevent a short between the third contact pad 240 and the bit line 230. Accordingly, the process margin for the third contact pad 240 may be ensured.

FIGS. 5A to 5D are cross-sectional views illustrating a method of manufacturing a semiconductor device in FIG. 4.

Figure 5A:
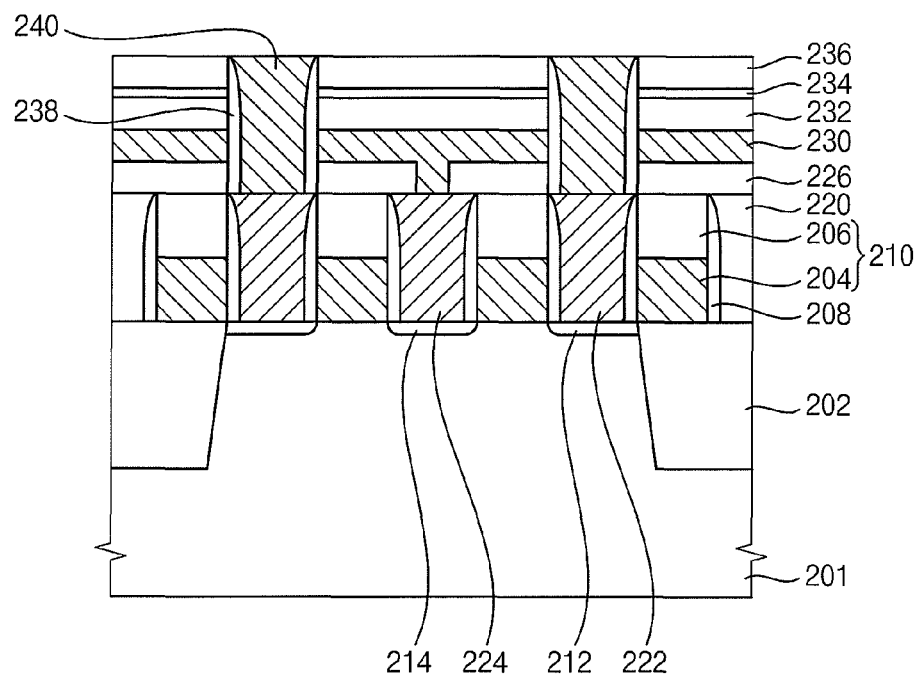

Referring to FIG. 5A, a gate structure 210, a gate spacer 208, a first insulation interlayer 220, a first contact pad 222, a second contact pad 224, a second insulation interlayer 226, a bit line 230, a third insulation interlayer 232, an etch stop layer 234, a fourth insulation interlayer 236, a pad spacer 238 and a third contact pad 240 are formed on a semiconductor substrate 201.

The above processes are substantially the same as the processes described with reference to FIGS. 2A to 2E, and thus any further explanations with respect to the same processes will be omitted.

Figure 5B:
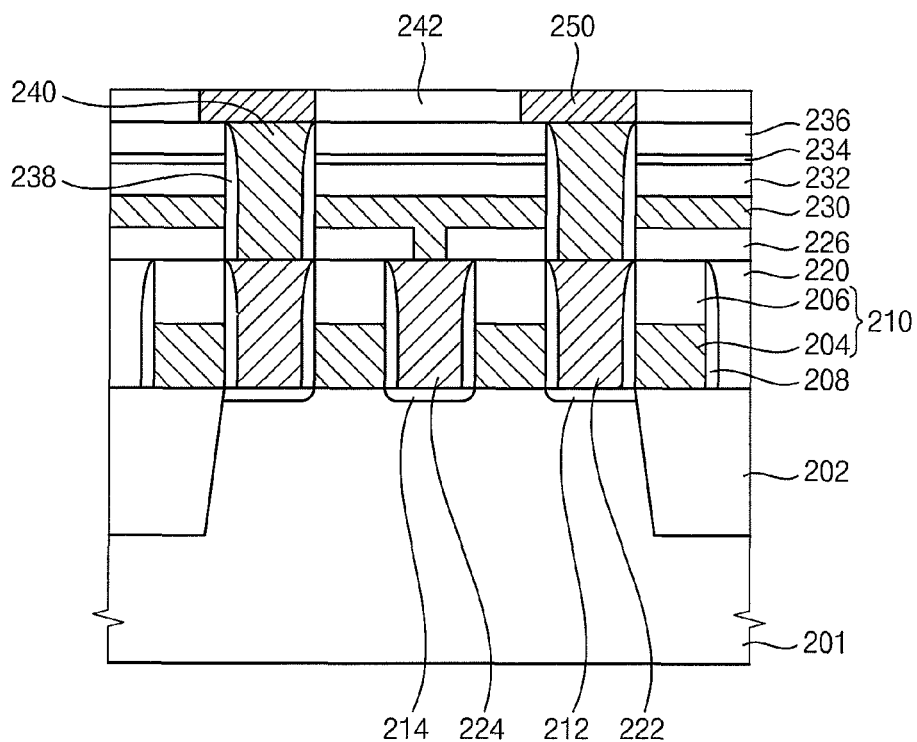

Referring to FIG. 5B, a fifth insulation interlayer 242 is formed on the fourth insulation interlayer 246 to cover the third contact pad 240 and the pad spacer 238. The fifth insulation interlayer 242 may be formed using, for example, an oxide. Examples of the oxide may include but are not limited to TEOS, HDP-CVD oxide, PSG, USG, BPSG, SOG, etc. The fifth insulation interlayer 242 may be formed by, for example, a chemical vapor deposition process, a plasma enhanced chemical vapor deposition process, a high density plasma chemical vapor deposition process, an atomic layer deposition process, etc.

After a photoresist pattern is formed on the fifth insulation interlayer 242, the fifth insulation interlayer 242 is, for example, anisotropically etched using the photoresist pattern as an etching mask to form a contact hole that exposes the third contact pad 240. For example, the contact hole may have a cross-sectional area greater than that of the third contact pad 240.

After the photoresist pattern is removed by, for example, an ashing and/or strip processes, a conductive layer is formed on the fifth insulation interlayer 242 to fill the contact hole. The conductive layer may be formed using, for example, polysilicon doped with a high impurity concentration, metal, conductive metal nitride, etc.

The conductive layer is planarized by, for example, a chemical mechanical polishing process or an etch-back process until an upper surface of the fifth insulation interlayer 242 is exposed, to form a landing pad 250 in the contact hole. The landing pad 250 may connect the third contact pad 240 to a lower electrode to be formed by a following process.

As the cross-sectional area of the contact hole is greater than that of the third contact pad 240, the cross-sectional area of the landing pad 250 is greater than that of the third contact pad 240.

Figure 5C:
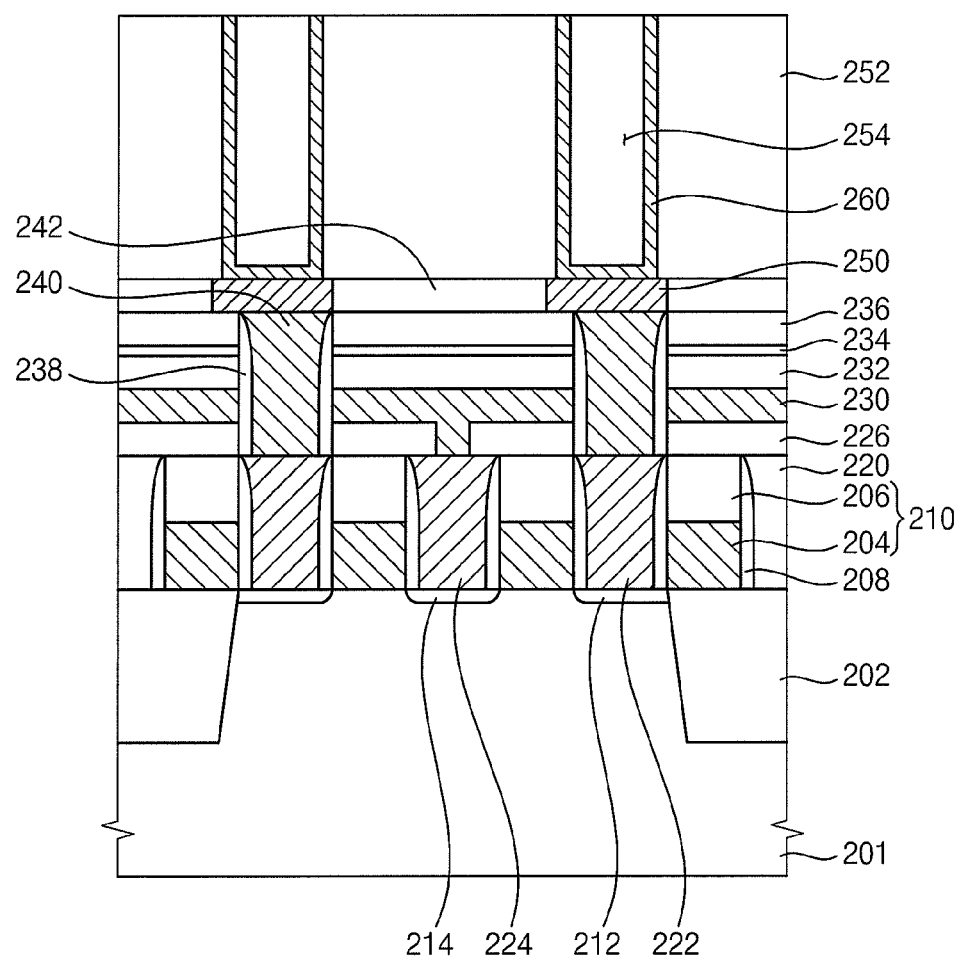

Referring to FIG. 5C, a mold layer 252 for forming a lower electrode is formed on the fifth insulation interlayer 242 having the landing pad 250 formed therein. For example, the mold layer 252 may be formed using an oxide. Examples of the oxide may include but are not limited to TEOS, HDP-CVD oxide, PSG, USG, BPSG, SOG, etc. The mold layer 252 may include, for example, at least two oxide layers of a stacked structure. The two oxide layers may have different etch rates. Accordingly, a sidewall shape of a lower electrode of a capacitor to be formed by a following process may vary due to the different etch rates of the at least two oxide layers.

The mold layer 252 is partially etched to form an opening 254 that exposes the landing pad 250.

Next, a conductive layer for a lower electrode is formed conformally on a sidewall and the bottom face of the opening 244 and an upper surface of the mold layer 252. Then, the conductive layer is planarized by, for example, a chemical mechanical polishing process until the upper surface of the mold layer 252 is exposed, to form a lower electrode 260.

As the lower electrode 260 is formed on the landing pad 250, the contact area of the lower electrode 260 and the landing pad 250 may be increased. Accordingly, the contact resistance of the lower electrode 260 and the landing pad 250 may be reduced and an align margin between the lower electrode 260 and the landing pad 250 may be ensured.

Figure 5D:
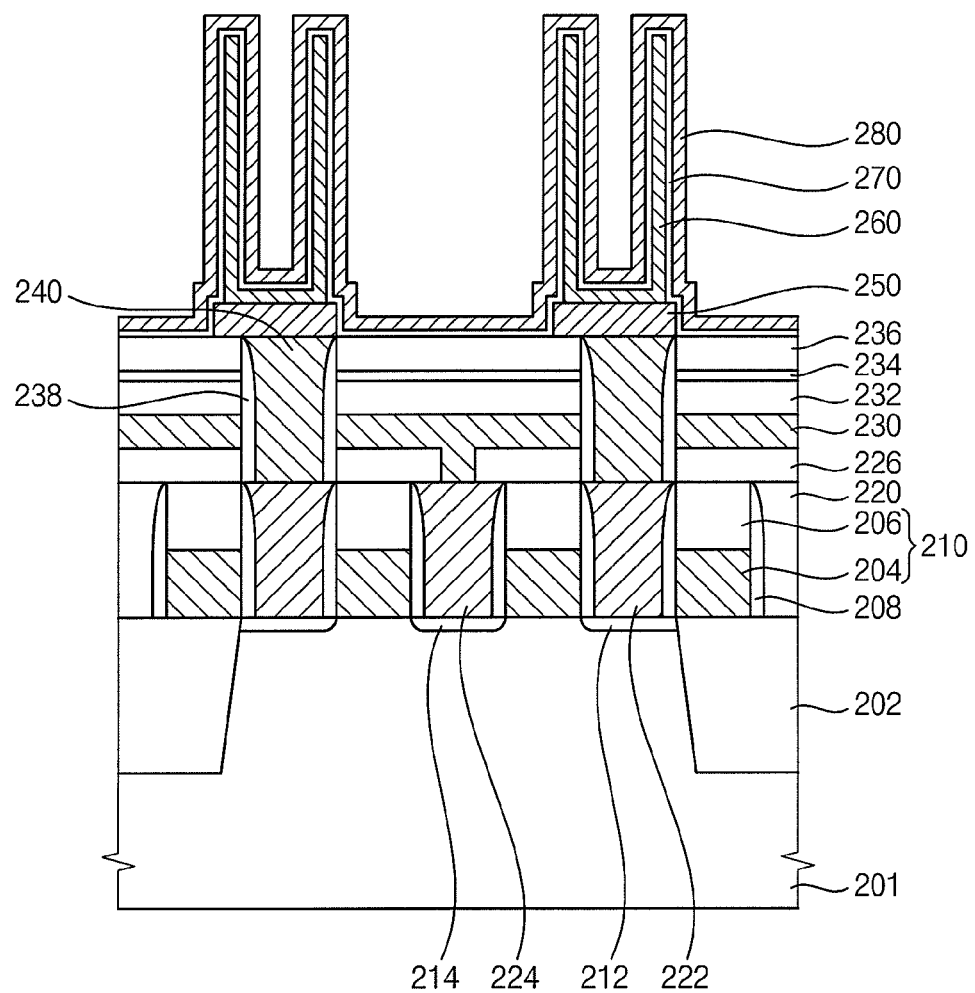

Referring to FIG. 5D, the mold layer 252 and the fifth insulation interlayer 242 are removed by, for example, a wet etch process using an etching solution. After a dielectric layer 270 is formed to have a uniform thickness on the lower electrode 260, the landing pad 250 and the fourth insulation interlayer 236, an upper electrode 280 is formed on the dielectric layer 270.

The above processes in connection with FIGS. 5C and 5D are substantially the same as the processes described with reference to FIGS. 2G to 2H, except for removing the mold layer 252 and the fifth insulation interlayer 242 using the etching solution, and except that the dielectric layer 260 is formed on the lower electrode 260, the landing pad 250 and the fourth insulation interlayer 236.

Through the above processes, a semiconductor device 200 is completed.

The pad spacer 238 of the semiconductor device 200 may prevent a short between the third contact pad 240 and the bit line 230. Accordingly, a process margin for the third contact pad 240 may be ensured.

Further, the landing pad 250 may have a cross-sectional area greater than that of the third contact pad 240, to thereby increase the contact area between the lower electrode 260 and the third contact pad 240. Accordingly, the contact resistance of the lower electrode 260 and the third contact pad 240 may be reduced and an align margin between the lower electrode 260 and the third contact pad 240 may be ensured.

As mentioned above, according to example embodiments, a pad spacer may surround a contact pad that is connected to a lower electrode. Accordingly, a short between the contact pad and a bit line may be prevented and a process margin of the contact pad may be ensured.

Further, as the lower electrode contacts a protruding upper portion of the contact pad, the contact resistance of the lower electrode and the contact pad may be reduced and an align margin between the lower electrode and the contact pad may be ensured.

Having described the example embodiments of the present invention, it is further noted that it is readily apparent to those skilled in the art that various substitutions, modifications and changes may be made without departing from the scope and spirit of the invention which is defined by the metes and bounds of the appended claims.

What is claimed is:

1. A semiconductor device, comprising:
   a first insulation interlayer, an etch stop layer and a second insulation interlayer sequentially stacked on a substrate wherein a lower structure including a first contact pad is formed;
   a second contact pad penetrating the first insulation interlayer, the etch stop layer and the second insulation interlayer and contacting the first contact pad;
   a pad spacer provided between the second contact pad and the first insulation interlayer and the second insulation interlayer;
   a landing pad provided on the second insulation interlayer and contacting the second contact pad, the landing pad having a cross-sectional area greater than that of the second contact pad;
   a lower electrode contacting the landing pad; and a dielectric layer and an upper electrode sequentially provided on the lower electrode.

2. The semiconductor device of claim 1, further comprising a bit line formed in the first interlayer insulating layer, and wherein the lower structure further includes a third contact pad electrically connected to the bit line, and wherein the pad spacer is located on sidewalls of the second contact pad, surrounding the second contact pad.

* * * * *